United States Patent [19]

Liau et al.

[11] Patent Number: 4,935,939
[45] Date of Patent: Jun. 19, 1990

[54] SURFACE EMITTING LASER WITH MONOLITHIC INTEGRATED LENS

[76] Inventors: Zong-Long Liau, 30 Chilton St., Belmont, Mass. 02178; James N. Walpole, 58 Allen Farm La., Concord, Mass. 01742

[21] Appl. No.: 356,881

[22] Filed: May 24, 1989

[51] Int. Cl.$^5$ ............................................. H01S 3/08
[52] U.S. Cl. ................................ 372/98; 372/101; 350/96.15
[58] Field of Search ................ 372/98, 99, 101, 103; 350/96.15, 96.18

[56] References Cited

U.S. PATENT DOCUMENTS

| | | | |
|---|---|---|---|
| 4,151,487 | 4/1979 | Chi | 372/101 |
| 4,156,206 | 5/1979 | Comerford et al. | 372/101 |
| 4,468,850 | 9/1984 | Liau et al. | 29/569 L |
| 4,718,070 | 1/1988 | Liau et al. | 372/50 |
| 4,722,092 | 1/1988 | Liau et al. | 372/96 |
| 4,772,787 | 9/1988 | Trommer | 350/96.15 |
| 4,777,148 | 10/1988 | Liau et al. | 437/129 |
| 4,784,722 | 11/1988 | Liau et al. | 156/649 |
| 4,817,109 | 3/1989 | Miyauchi et al. | 372/99 |
| 4,829,531 | 5/1989 | Kawanishi et al. | 372/99 |

FOREIGN PATENT DOCUMENTS 227091 9/1988 Japan ........................... 372/101

OTHER PUBLICATIONS

"Large-Numerical-Aperture InP Lenslets by Mass Transport", Liau et al., *Appl. Phys. Lett.* 52(22), May 30, 1988, pp. 1859-1861.

"Fabrication and Characterization of InP Fresnel Microlenses", Diadiuk et al., Topical Mtg on Semiconductor Lasers, 2/10/87.

"Diode Lasers with Cylindrical Mirror Facets and Reduced Beam Divergence", Walpole et al., Topical Mtg on Semiconductor Lasers, 2/10/87.

M. W. Fleming and A. Mooradian, *IEEE J. Quantum Electron*, QE-17 (1981).

R. H. Rediker, R. P. Schloss and L. J. Van Ruyven, *Appl. Phys. Lett.* 46, 133 (1985).

J. R. Leger, M. L. Scott and W. B. Veldkamp, *Appl. Phys. Lett.* 52, 1771 (1988).

"Mass-Transported GaInAsP/InP Lasers", Liau et al., *The Lincoln Laboratory Journal*, vol. 2, No. 1 (1989).

Primary Examiner—William L. Sikes
Assistant Examiner—Robert E. Wise
Attorney, Agent, or Firm—Hamilton, Brook, Smith & Reynolds

[57] ABSTRACT

A surface emitting laser is described with a monolithic integrated lens formed in one side of an optical semiconductor substrate aligned with a parabolic light reflective mirror surface formed adjacent an edge emitting laser formed on, or in, the other side of the substrate. An optional optical feedback spherical mirror is formed concentric to the lens.

31 Claims, 6 Drawing Sheets

SURFACE EMITTING LASER WITH MONOLITHIC INTEGRATED LENS

GOVERNMENT SUPPORT

The Government has rights in this invention pursuant to Contract No. F19628-85-C-0002 awarded by the U.S. Air Force.

BACKGROUND ART

Conventional semiconductor lasers are small discrete devices formed of an active lasing medium confined in a waveguide between front and rear, partly reflective, mirrors. Laser light is emitted out an edge of the active lasing medium.

A great deal of research and development effort has been expended in an attempt to form surface emitting lasers; that is, lasers which emit light perpendicular to the longitudinal plane of the active medium out an upper or lower surface of the laser structure.

One such device is illustrated in U.S. Pat. Nos. 4,784,722 and 4,718,070 to Liau et al.

In the structure of Liau et al., a light transmissive mirror surface is formed adjacent the light emitting edge of a buried-heterostructure (BH) laser. A parabolic mirror is formed adjacent the mirror surface to collimate and redirect light emitted from the edge in a plane perpendicular to the active layer.

Figure 7:
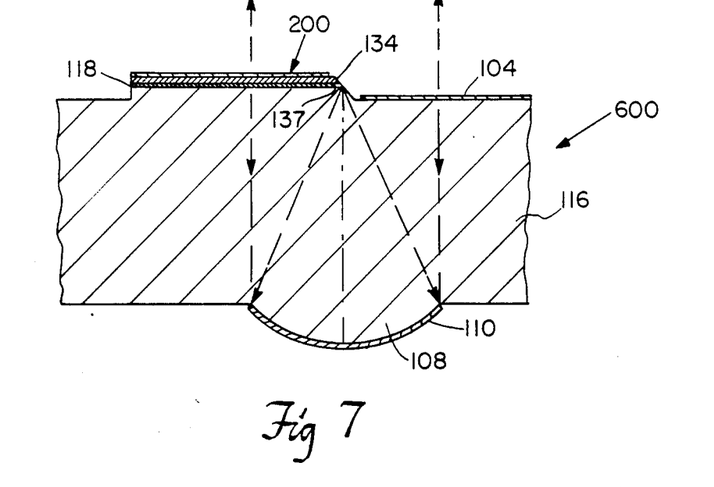
FIG. 7 is a schematic view of a yet another embodiment of the invention in which the lens is replaced by a parabolic mirror.

In the embodiment of FIG. 7, a pair of 45° light reflective mirrors are fabricated adjacent the light emitting edge of the active layer of a BH laser. The 45° mirrors direct edge-emitted light out the substrate surface at a 90° angle to the plane of the active layer. Two partly light transmissive mirrors are provided between the 45° mirrors and the substrate surface by etched air gaps. These mirrors provide optical feedback to the laser to sustain oscillation within the Fabry-Perot intracavity formed between the output mirrors at 106.

The Liau et al. patents also describe a lens formation embodiment (FIGS. 5-6) wherein a collimating lens may be formed on a substrate or, optionally, formed at the bottom of the FIG. 7 substrate to further collimate light emitted from the substrate surface (See col. 9, lines 1-13).

The above described Liau et al. invention solves a number of problems present in conventional laser devices by providing an integrated lens for coupling a surface emitting laser beam to external optics. Conventional semiconductor lasers produce beams with large beam divergence of 30°, or more, making coupling to external optics difficult. With a properly aligned monolithic lens system, large refractive index semiconductor material can be used to form high quality large-numerical-aperture lenses which can result in an output beam divergence less than 1° for lens diameters greater than 100 μm.

However, a need still exists for a method and resulting process and laser device in which the lens is accurately aligned with the reflective mirror surface of the laser.

DISCLOSURE OF THE INVENTION

A monolithic lens integrally formed on a substrate with a laser is disclosed, in which the light-reflective surface of the laser is accurately located at the focal point of the lens. A lens is formed on one side (lens side) of the substrate. A laser precursor structure with an n-lasing active layer sandwiched between upper and lower p-n layers is formed on the opposite side (laser side) of the structure. Light is projected through the lens to the laser side of the substrate to project an image at the lens focal point on the laser side of the substrate. This image is used to form an alignment mark to determine the location of a light reflective surface to be formed at the lens focal point. The light reflective surface is then formed at the intersection of the optical axis of the lens and the plane of the active layer.

The laser structure is then completed by isolating the active layer laterally and forming upper and lower electrical contacts.

Preferably, reflective spherical mirrors may be formed concentrically within, or around, the lens surface to provide optical feedback to the lasing medium to promote or sustain oscillation.

The reflective surface may be a simple plane located at a 45° angle to the active strip edge or a parabolic surface. The laser may comprise a buried heterostructure of III-V materials, or alloys thereof. A plurality of such laser/lens combination may be formed on a single substrate to produce a surface-emitting laser array.

Preferably, the lens and laser are formed by a mass-transport process wherein the profile of the end structure is approximated by a multi-level mesa lens precursor produced by etching the substrate surface. The approximated multi level structure is then smoothed to the desired profile by heating the structure in the presence of a protective gas flow (or ambient). such as $H_2$ and $PH_3$, which causes transport of the III-V material in an amount and direction which results in the desired profile.

A detailed description of the invention follows in connection with the drawings.

DETAILED DESCRIPTION OF THE INVENTION

I. Lens and Mirror Formation

Figure 1:
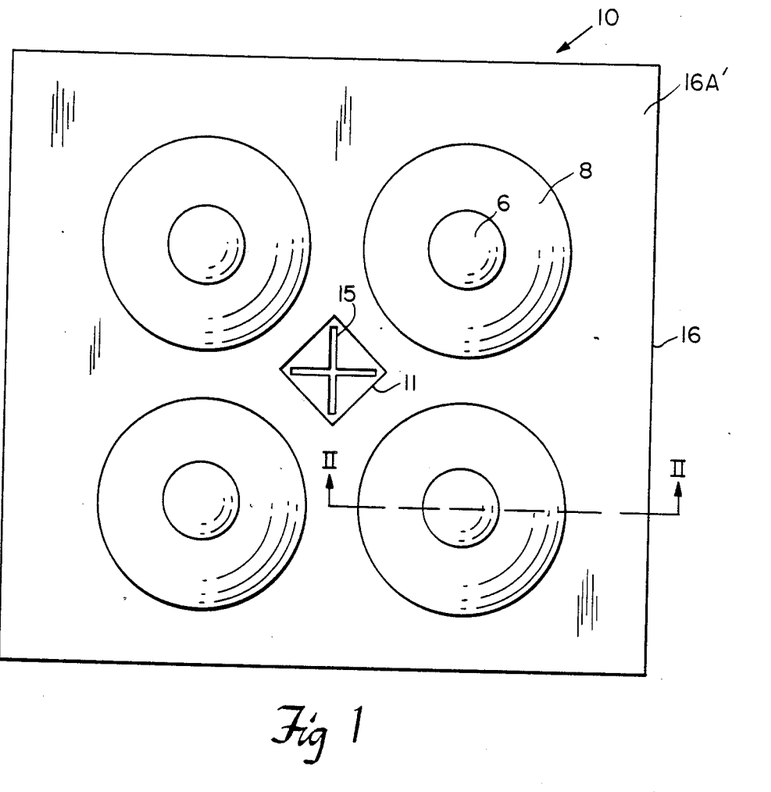
FIG. 1 is a planar top view of a surface emitting laser array 10 of the invention.

Referring now to FIGS. 1-4, the invention will now be described in detail. FIG. 1 shows a top plan view of a two-by-two array 10 of surface emitting lasers, each of which is provided with a collimating lens 6 and concentric reflective mirror 8 integrally formed in the top surface 16A of substrate 16. For simplicity, only four lens/laser structures are shown in FIG. 1. It should be understood, however, that one wafer may contain a multitude of such structures.

The starting structure consists of an InP substrate 16 (FIG. 2) which is doped with an n-type dopant, such as tin, to a concentration of about $1 \times 10^{18}$ cm$^{-3}$, with both sides 16A and 16B polished and with a uniform thickness of about 400 $\mu$m. The substrate is free etched in bromine-methanol to remove any possible polishing damages in the first few microns.

Figures 4, 4A:
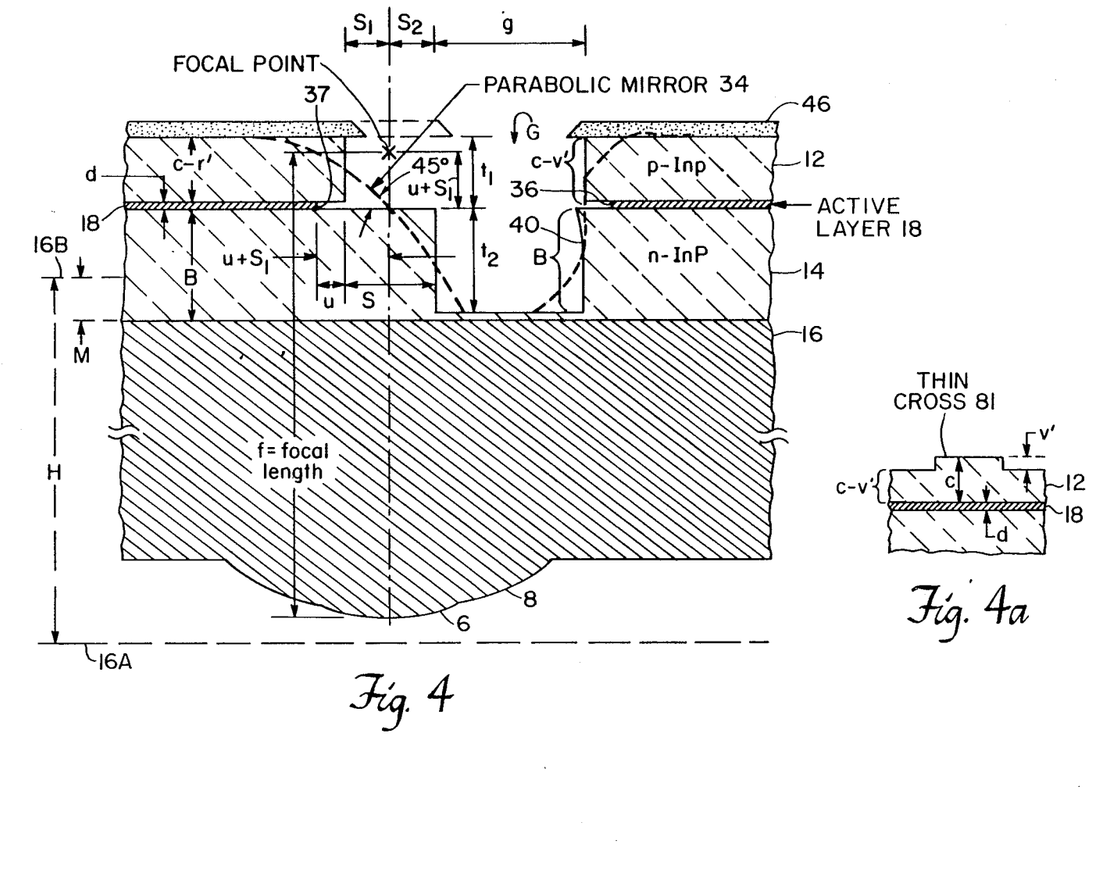
FIG. 4 is a schematic illustration of how the active region and parabolic mirror of the laser is formed with respect to the lens/mirror structure.
FIG. 4(a) is a partial enlarged view of a portion of FIG. 4.

The substrate thickness H will become essentially the focal length f of the collimating lens 6 in the present integrated structure, but with the following corrections:

$$f = H - \gamma - M + B + s_1 + \gamma$$

wherein:

B = buffer layer 14 thickness, $s_1$ = distance from lens axis A to the first sidewall of the stair structure (See FIG. 4), and u = undercut of the quaternary layer 18 in the etching of the stair structure (See FIG. 4). The correction parameters $\gamma$ and M are related to the laser construction and fabrication, as will be described below.

Figure 3:
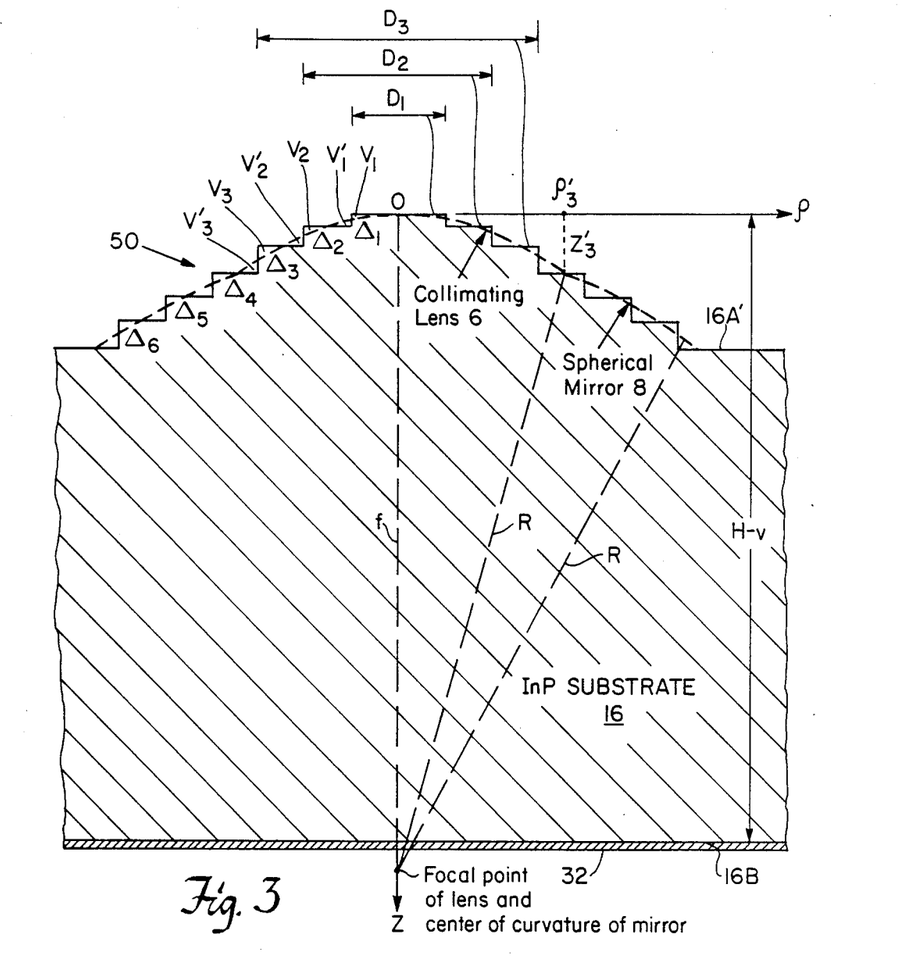
FIG. 3 is a schematic illustration of how the lens/mirror portion of the laser is formed.

The profile z of the collimating lens is given by:

$$z = \frac{f}{n+1}\left[\sqrt{1 + \frac{n+1}{n-1}\frac{\rho^2}{f^2}} - 1\right]; \quad \text{Equation 1}$$

where n is the refractive index of the InP substrate 16 (=3.2 at 1.3 microns wavelength) and $\rho$ is the radial distance from the axis of the lens to a point on the profile z and f is the focal length (See FIG. 3). This lens profile equation is based on optical path length considerations (equivalent to the ray-tracing lens design using Snell's law of refraction) for collimating light from a point source (without spherical aberration).

The lens profile formula of Equation 1 is used to calculate the etching step heights ($\Delta_1$, $\Delta_2$ and $\Delta_3$) required to fulfill the equal-volume requirement for mass transport. (See column 4. lines 7-14 of U.S. Pat. No. 4,784,722.) In accordance with the rule, the solid line etched stair structure 50 of FIG. 3 is fashioned such that the regions between the solid line and the desired profile of the dotted line have equal volumes V (i.e., $V'_n = V_n$)

The radius of curvature R of the spherical mirror is then calculated, i.e., $$R = \sqrt{(f - z'_3)^2 + \rho'^2_3}$$

wherein f = focal length of the lens described above
$z'_3$ = thickness of the lens and
$\rho_3$ = axial radius of the lens as shown in FIG. 3.

Next, the etching step heights ($\Delta_4$ through $\Delta_{10}$) are calculated for the spherical mirror, again using the equal-volume requirement rule.

Phosphosilicate Glass (PSG) 30 (shown in dotted lines) is deposited on the lens side 16A (FIG. 2) and SiO$_2$ 32 on the other side (FIG. 3), both approximately 0.5 $\mu$m in thickness. Photolithography is used to define crosses 15 of thin lines (1-2 $\mu$m wide and 50 $\mu$m long) in between areas designated for lenses or in regions not used for lenses over the wafer on the lens side. The wafer is mounted on a silicon substrate (not shown) to protect the SiO$_2$ on the laser side 16B during handling and processing. The thin crosses are formed on the InP substrate 16 by etching the surrounding material to the designed depth $\gamma$, which is usually 0.1-0.5 $\mu$m (See FIG. 3a). These thin crosses are used as alignment marks in the subsequent lithographic steps for lens/spherical mirror fabrication.

The PSG 30 and SiO$_2$ 32 is then removed and the wafer cleaned. PSG and SiO$_2$ are redeposited and using photolithography, the disc D$_1$ in solid lines is defined by a mask of PSG. The material not underlying the mask is etched using iodic acid (20 weight percent in water) to the first mesa step $\Delta_1$. The etching is carried out in a temperature-controlled bath and the etching rate is pre-calibrated by using a small piece cleaved from the same InP wafer.

The above step process is repeated to define and etch all the mesa steps ($\Delta_2$ through $\Delta_{10}$) for the lens 6 and mirror 8 step by step. Accurate alignment of these discs is achieved by reference to the thin crosses initially etched in the wafer. But, some "guards" 11 (FIG. 1) have to be implemented in the disc masks such that, in each disc exposure, some thin crosses are always preserved (un-exposed and thus protected from the etching) and can be used for the subsequent disc alignment. The photolithographic masks are designed such that the designated thin crosses are always well-defined and clearly visible for easier alignment. "Guards" 11 (FIG. 1) should have as large an area as possible to minimize the photoresist thickness variation when the wafer becomes increasingly non-planar in the etching of the multi-level mesa structure. A "single opening" mask can be used to selectively remove the photoresist and PSG from the designated alignment marks to greatly improve the visibility of the marks. The crosses in the disc masks are smaller than the ones originally etched in the starting wafer, so that the alignment of the two can be clearly seen.

By using the same etchant (dispensed from a pre-mixed large quantity) and the same controlled temperature, the etching rate is reproducible and accurate etching depth can be obtained very conveniently by timing.

After thorough cleaning, the etched wafer is placed in a graphite container and loaded into a furnace system for mass transport, which is carried out at approximately 870° C. in PH$_3$ (phosphine gas) (5%) and H$_2$ flow. Since a relatively long mass transport time (30-100 hours) is needed to smooth a large step ($\Delta D = 20$ $\mu$m) by mass transport, the furnace system must be capable of handling the resulting phosphorus deposit. To obtain the best result, the furnace tube should be cleaned and baked along with the graphite container prior to loading the wafer.

After mass transport, the lens formation (i.e., the smoothing of the stair structure) can be examined under a microscope. If more mass transport is needed, the wafer can be reloaded into the furnace for more mass transport. A recently developed theory (Z. L. Liau and H. J. Zeiger, to be published) shows that mass transport should follow a $t^{\frac{1}{4}}$ time dependence, i.e. $\Delta t$ is proportional to $t^{\frac{1}{4}}$. In other words, the radial distance a material is transported is proportional to the $\frac{1}{4}$ power of the time the material is subjected to thermal mass transport temperature. This is a useful guide for estimating the transport time needed. However, the absolute rate may depend on a number of factors, such as the gas ambient and the wafer doping, and has to be evaluated in each experiment by examining the outcome of the first transport. Fortunately, the $t^{\frac{1}{4}}$ time dependence or $A_4$ wavelength dependence, when the evolution of surface profile due to mass transport is described using Fourier analysis, provides essentially a self-controlled process, because once the small (etched) steps are smoothed, the process virtually stops. Any further change of the overall lens profile can occur only in an enormously longer time scale.

After mass transport is completed, the optical quality of the lens is conveniently investigated under an optical microscope. The lens surface reflects visible light and can form images for objects (a slide image, for example) placed near the microscope light source. From the quality of the image, the quality of the lens can be monitored. From the size of the image, the focal length f of the lens (or radius of curvature of the spherical mirror) can be evaluated.

II. Laser Precursor Formation

A liquid-phase epitaxy (LPE) process is then carried out to grow the precursor structure for the BH laser 100 on the bottom side 16B of the wafer 16, as generally shown in U.S. Pat. No. 4,784,722 in connection with FIGS. 3 and 3a of the patent. The growth parameters are adjusted such that there will be meltback of the wafer to the designed thickness M of about 1 μm and subsequent growths of the buffer 14, active 18 and cap 12 layers of thicknesses. B, d and c, respectively (See FIGS. 4 and 4a). Note: In LPE, it is desirable to do an in-situ etch of the wafer surface prior to the growth of the first layer. This is called meltback in LPE, because a molten pure indium is used to do the etching.

Briefly, the procedure is as follows:

After etching the indium phosphide substrate to the depth M, a layer 14 of indium phosphide is formed by LPE over the substrate 16. This layer serves as a buffer layer and is preferably n-doped with tin to a concentration of about $2 \times 10^{18}$ cm$^{-3}$. The thickness B of layer 14 is about 2.5 μm. The buffer layer 14 of indium phosphide is formed on the substrate 16 prior to LPE growth of active layer 18 to eliminate surface defects in the substrate surface of the type caused by thermal etching, etc. Thus, layer 14 and substrate 16 may be considered generally to constitute a substrate for the diode structure formed thereon.

An active layer 18 of GaInAsP is formed over the buffer layer 14. The active layer is a very thin film of thickness d of about 0.2 μm and is unintentionally n-doped to a concentration of about $1 \times 10^{17}$ cm$^{-3}$.

Next, a layer 12 of indium phosphide is provided over layer 18 with a p-type dopant to a concentration of about $5 \times 10^{17}$ cm$^{-3}$ to form a planar p-n junction somewhere between the p-layer 12 and the n-layer 14. Top layer 12 has a thickness c of about 3 μm. Preferably, the substrate 16 is oriented in the (100) crystallographic plane.

III. Lens Alignment and Laser Mirror Formation

The epitaxial (laser) side is then coated with PSG and the lens side with SiO$_2$. The wafer is placed under a microscope, laser side up. Since InP is transparent to infrared and not transparent to visible light, the microscope is an infrared scope operated in a transmission mode to see the bright spots on the laser side due to the infrared light concentration by the lens/spherical mirrors on the other side. The positions of the concentrated spots of light, relative to some visible defects on the laser side, are recorded by taking photographs on an infrared image display. The laser side 16B is then coated with photoresist (not shown) and a thin cross pattern aligned to the positions of the concentrated infrared light is defined by using the aforementioned surface defects as an alignment reference. The concentrated infrared light spots cannot be seen at this moment, unless a special infrared mask alignment equipment is used. In these procedures, the wafer is glued lens side down to a silicon substrate to protect the lenses.

The thin cross pattern is etched to the grown InP cap layer 12 to a depth γ' (See FIG. 4a). The wafer is placed under the infrared microscope again and the relative positions of the thin crosses and the axis of the lens/spherical mirrors is accurately measured. To obtain a correct measurement, it is necessary to do the measurement more than once with a rotation of the wafer in between measurements. This is to guard against any tilting of the microscope light source with respect to the optical axis of the lens/spherical mirror. Such tilt will result in a shift of the concentrated spot of light, which can be detected by wafer rotation and can be further eliminated by averaging the shifted positions. The thin crosses are now used as a reference for the definition of the 45° mirror surface 34 (FIG. 4).

Figure 2:
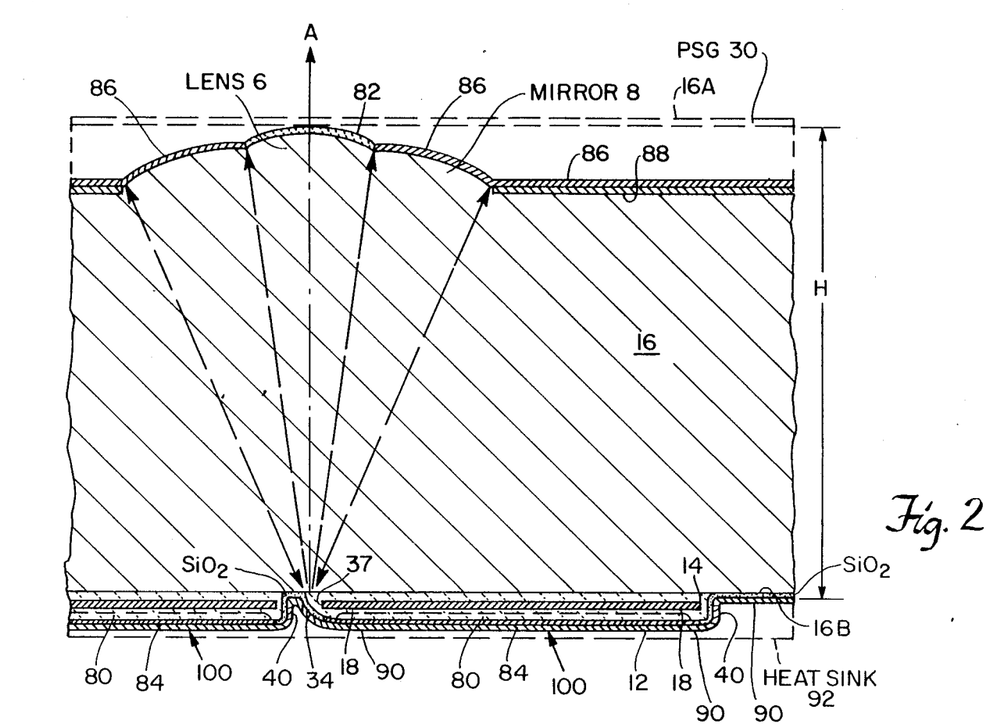
FIG. 2 is a schematicized cross-section of one of the finished laser/lens/mirror structures comprising the array taken along lines II—II of FIG. 1.
Figure 3A:
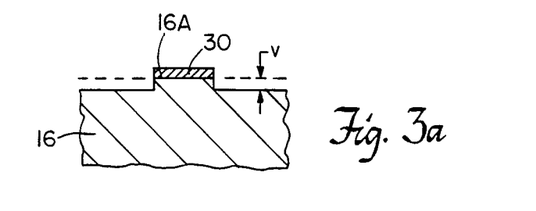
FIG. 3(a) is a partial enlarged view of a portion of FIG. 3.

The 45° mirror surface is used to deflect the light "internally", so that the resonant cavity is between the spherical mirror 8 and the vertical back mirror 40, as shown in FIG. 2.

First an oxide mask of SiO$_2$ or PSG 46 is formed on the top surface of layer 12 with openings formed to expose portions of the p-InP layer 12 in the area where the mirrors are to be located. A groove is formed down to the top of layer 14 by a two-step selective chemical etch procedure described in Section I of U.S. Pat. No. 4,784,722.

The groove G is made at a calculated distance g/2+s$_2$ wherein g=width of the deep groove and s$_2$=0.6 t$_1$. Note: The value of g depends on photolithography and etching and is experimentally determined beforehand. In this way, the resulting parabolic mirror surface 34 will be exactly centered with respect to the axis A of the lens and spherical mirror 6/8. Next, the mask 46 is partially removed on the side in which the parabolic mirror surface 34 will be formed using photolithography and buffer-HF etching. The selective chemical etch procedure is then repeated to produce the two-step or stair structure shown in FIG. 4 on one side of the groove G and a nearly vertical profile on the opposite side adjacent edge 36. The vertical facet 40 will become the back mirror of the next laser. It will eventually be metallized and used as a reflector for the resonant cavity of the next longitudinally adjacent laser. The light-emitting edge is 37 as indicated in FIG. 4. The 45° mirror or parabolic surface deflects the light internally (inside the semiconductor) toward the lens/spherical mirror 6/8.

Surface 34 can simply be a 45° inclined mirror surface, or, as shown in FIG. 4, preferably is made parabolic, to help in collimating the light diffracting out of the BH waveguide from the edge 37 and, more importantly, to help recapture the light reflected back from the spherical mirror 8. Otherwise, the precision of the spherical mirror and its alignment with respect to the 45° mirror will be highly critical. The following formulas can be used in the etching of the stair structure that can result in the desired parabolic profile:

$$t_1 = c - \gamma' + d$$
$$s = 1.266 t_1$$
$$t_2 = 1.43 t_1.$$

wherein:
- $\gamma'$ = height of thin cross alignment marks on the laser side
- d = active layer 18 thickness
- $t_1$ = height of the first step in the stair structure
- $t_2$ = height of the second step in the stair structure
- c = LPE grown cap layer 12 thickness on the laser side.

This is derived from an "equal area requirement" rule similar to that described in U.S. Pat. No. 4,784,722, column 7, lines 20-48. After etching, the wafer 10 is stripped of the mask layer 46, thoroughly cleaned and loaded into a furnace system for mass transport at a temperature of 690°-740° C. in an $H_2$ and $PH_3$ atmosphere for 10-20 hours, to form a nearly parabolic mirror surface 34 out of the stair structure and a smooth vertical surface 40 out of the nearly vertical profile.

The 45° parabolic mirror profile (especially the precise control of the 45° angle) can be accurately monitored by examining the cross-section from a small piece cleaved from a wafer edge.

IV. BH Laser Formation

Using photolithographic techniques, oxide stripes (not shown) are provided over the layer 12. The stripes of oxide are 5-6 µm wide on 250 µm centers with the stripes parallel to the (011) crystallographic planes. The stripes provide a mask for subsequent mesa-isolation of the individual BH lasers 100.

Next, buried mesa structures for isolation and burying the active layer 18 are formed by etching, as generally described in U.S. Pat. No. 4,468,850. Briefly, concentrated HCl or Bromine.methanol etchant is used to remove the portions of the InP top layer 12 not underlying the previously noted oxide stripes (not shown) down to the active layer 18. The oxide is then removed and both sides of the exposed active layer are removed and undercut to a depth of about 4 µm. The structure is then heat.treated at a temperature of about 650°-700° C. in the presence of phosphine to cause migration of the material adjacent the undercut, thereby burying the active region 18 on both sides of the mesa.

The wafer is then contact metallized in the usual way, with some exceptions. (See lines 60-68, column 7 and lines 1-14. column 8 of U.S. Pat. No. 4,784,722.) A shallow zinc diffusion is made through openings on an oxide mask (not shown) formed on the laser side 16B (See FIG. 2) to form a p+ contact region 80. Au/Zn alloy contacts 84 are formed on the diffused region 80. An Au/Sn alloy contact 88 is applied to the lens side The lens/spherical mirror 6/8 is protected by an $SiO_2$ mask 82 from the Au/Sn deposition and alloying in the n-type ohmic contact formation. A subsequent Ti/Au metallization 86 is also applied on the lens side. The spherical mirror 8 is also coated with Ti/Au 86 as a convenient high reflection coating. The $SiO_2$ mask 82 can remain on the collimating lens (deposited to 0.23 µm thickness) as a convenient anti.reflection (AR) coating, although a separate SiO evaporation can produce an optimum AR coating.

On the laser or p-side, a Ti/Pt/Au metallization 90 is applied over the entire wafer, including the laser rear (vertical) mirrors 40.

The wafer can now be saw cut to form individual devices or the entire wafer can be used as a laser array. The device may be mounted junction-side down on a heat sink 92 (shown in dotted lines), which is favorable for cooling.

V. Central Spherical Mirror Embodiment

Figure 5:
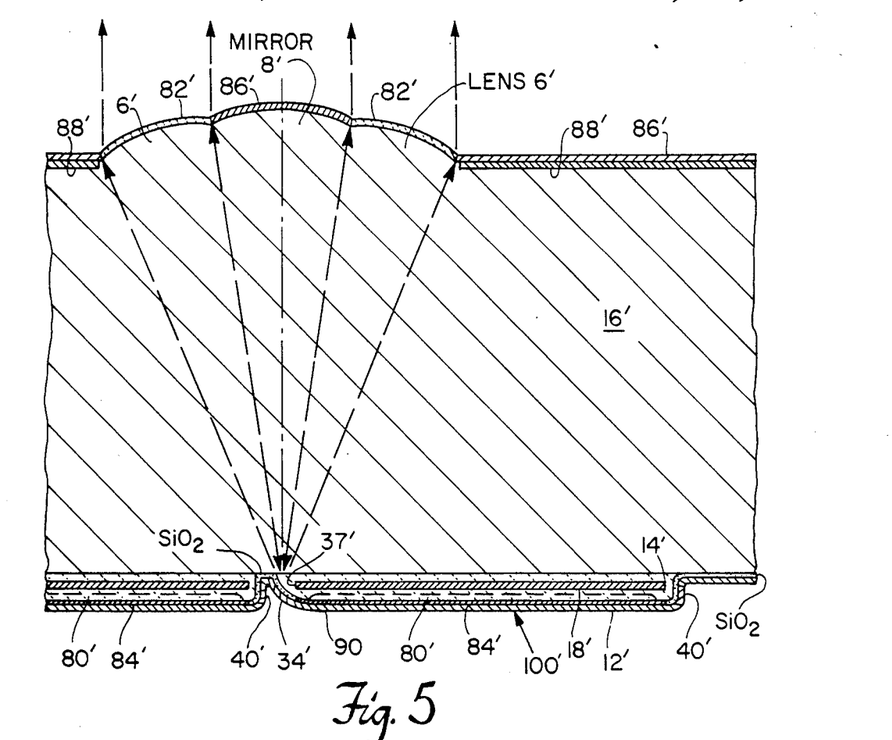
FIG. 5 is a schematicized cross section of an alternate embodiment in which the lens surrounds the mirror.

An alternate embodiment is shown in FIG. 5 wherein the collimating lens 6, is formed in substrate 16' concentric to, but radially outward from, the central spherical mirror 8', also formed in substrate 16'. In this embodiment, items in FIG. 5 corresponding to like items in FIG. 2, carry a prime suffix.

Individual lasers 100' are formed with layers 12', 18' and 14', as previously described, with an internally reflective 45° mirror surface 34' located at the focal point of lens 6' and center of curvature of central spherical mirror 8'. Light emanating from edge 37' of layer 18' is reflected off surface 34' to mirror 8' and lens 6'. The light impinging upon lens 6' is collimated and radiated from the surface of substrate 16'. Mirror 8' forms part of the laser cavity. Light reflected back from mirror 8' is deflected by the parabolic mirror 34', fed back into the active layer 18' and eventually reflected by the back wall 40' to provide feedback to sustain laser oscillation.

Appropriate contact metallization 88' and 84' and surface protection or AR coating 82' or reflection coatings 86' and 90' are provided, as described before.

VI. Lens-Only Embodiment

Figure 6:
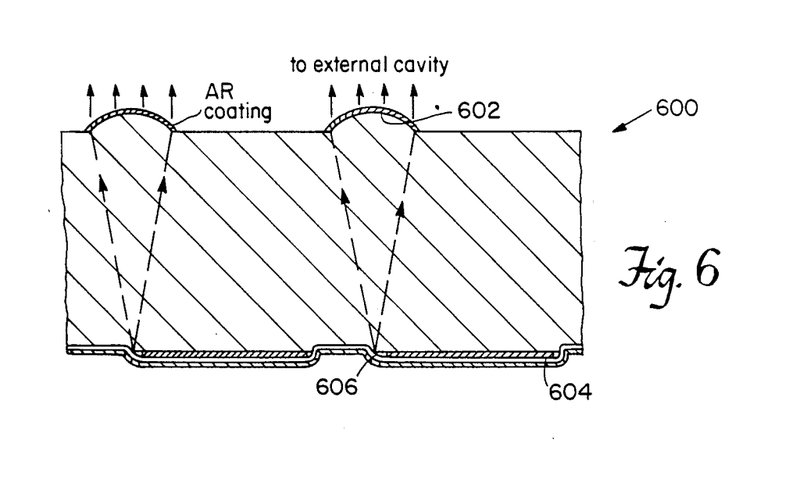
FIG. 6 is a schematicized view of another alternate embodiment in which the laser is coupled to an external cavity.

In this case, the device 600, as shown in FIG. 6, is structured so as not to lase on its own, but to be placed in an external cavity (not shown), which is enormously larger than the device. The laser light from laser 604 is deflected by parabolic surface 606 to microlens 602 formed as before. The microlens 602 collimates the light and makes coupling with the external cavity much easier. External cavity operation of semiconductor lasers has a number of important advantages, such as very narrow line widths [M. W. Fleming and A. Mooradian, *IEEE J. Quantum Electron,* QE-17, 44 (1981)]. Moreover, an external cavity can be used to coherently phase.lock a monolithic array of the present devices. i.e., the entire array can be coupled together and operate like a single laser with well-controlled optical phase relationship among array elements. This can be achieved either by using a Fourier transform spatial filter [R. H. Rediker. R. P. Schloss and L. J. Van Ruyven, *Appl. Phys. Lett.* 46, 133 (1985)] or by using diffraction coupling. The latter is possible because the microlenses are of a finite size (i.e., 100-200 µm diameter) and the light still diffracts, although at a small angle. Efficient diffraction coupling and phase control can be obtained by using the Talbot self-imaging effect [J. R. Leger, M. L. Scott and W. B. Veldkamp, *Appl. Phys. Lett.* 52, 1771 (1988)], in which the feedback mirror is placed at one of the Talbot distances and the diffraction pattern fed back to the array is exactly identical to the original array pattern.

The present embodiment also allows the device to be used as a receiver. The laser active region can thus be operated as a photodetector, amplifier, or modulator, as explained below in Section VIII.

VII. Parabaloid Embodiment

FIG. 7 illustrates in schematic form a parabolic mirror structure 600 of the invention wherein a parabolic mirror 108 is formed on a suitable transparent semiconductor substrate 116 opposite a monolithically integrated laser 200, each of which is formed as previously described.

Light from edge 137 of active layer 118 is internally reflected by 45° mirror surface 134 toward parabolic mirror 108. Mirror 108 is coated with reflective metallization 110; such that light impinging on mirror 108 is collimated and reflected back toward flat output mirror surface 104. This surface is partially reflective, so that some of the light is transmitted and some is fed back to promote and sustain laser oscillation.

VIII. Detector Embodiment

Figure 8:
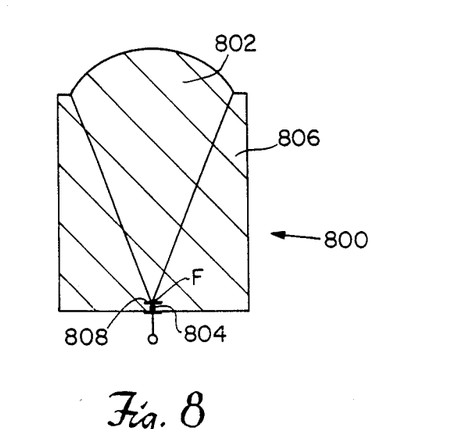
FIG. 8 shows another embodiment of the invention wherein the lens is used to focus light on a detector.

In the embodiment of FIG. 8, the lens 802 is formed in a suitable substrate 806 to focus light on a very small detector 804 located at the focal point F to form a monolithic integrated detector. The device 800 is formed as before with the lens 802 formed first on the lens side of the substrate 806 and then small detector surface 808 is formed on the opposite side of the substrate at the lens focal point using the process previously described for locating the 45° mirror surface.

The ability to precisely locate and form the plane of the detector surface at the lens focal point will enable very small and, hence, very fast detectors to be fabricated.

This completes the description of the preferred embodiments of the invention, however, it is to be understood that while lasers using a heterojunction of the quaternary III-V alloys of indium gallium arsenide phosphide have been chosen to illustrate the invention; other alloys may be utilized equally as well. As an example, alloys of the IV-VI semiconductors, such as germanium IV and selenium VI and lead and tellurium, may be utilized. Similarly, instead of indium phosphide, other III-V alloys could be substituted, such as gallium antimonide.

The term quaternary III-V alloy of InGaAsP means that the elements are proportioned according to the formula, $In_xGa_{1-x}As_yP_{1-y}$ or the equivalent mole fraction formula $In_{0.5x}Ga_{0.5-0.5x}As_{0.5y}P_{0.5-0.5y}$. Also, the invention is not to be limited to any particular etchant, merely that one of the etchants has to be capable of etching the active layer with negligible etching of the other layers.

While the heretofore described embodiments have been explained in connection with the use of a wet chemical etching process, it is also contemplated that other means of producing the undercuts or grooves may be realized by those skilled in the art, such as plasma etching or reactive ion etching.

The process herein described could be used for fashioning any type of mirror or lens surface, not merely vertical or parabolic or 45° angles. Hyperbolic and elliptical surfaces can be envisioned utilizing the teachings of this invention.

While the particular embodiments of the invention disclosed herein have been fabricated utilizing LPE techniques, it should be emphasized that suitable layers could be formed using other deposition techniques, such as vapor phase epitaxy or molecular beam epitaxy. Additionally, whereas the substrates enumerated herein have been n.type indium phosphide, it is clear that the substrate could be a semi-insulating substrate, or p-type, in which case, the top layer would be of opposite n-type conductivity, although p-type substrates are less transparent to light. Also, additional quaternary or other layers may be present in addition to those layers above enumerated. Instead of growing the buffer, active and cladding layers on the InP substrate, such layers could be formed in the substrate as by ion implantation. The term "on" the substrate is therefore intended to include layers grown, or formed, "on" or formed "in" the substrate, such as implanted layers. Additionally, it is possible to grow material on the substrate which is then formed into a lens. Consequently, the term "in" the substrate is meant to encompass lenses formed either "on" or "in" the substrate.

It is envisioned that the approximate final contour of the mirror surfaces may be achieved by discrete etchant steps, as explained herein, and the steps filled in by supplying material from an external source, such as by depositing material by LPE, instead of using the mass transport phenomenon to smooth out the approximated surface contour. Other type laser structures may be formed in place of the BH structure of the present invention, such as multiple quantum well (MQW) or distributed feedback (DFB) lasers. Alignment could be simplified by providing an IR sensitive resist on the laser side, so that index spots could be transferred from the lens side by exposing the resist and etching the exposed pattern.

Hence the invention is not to be construed as limited to the particular embodiment shown and described herein. There are many equivalents to these specific embodiments and such equivalents are intended to be covered by the following claims:

We claim:

1. In a monolithic lens-laser device, the element comprising:
    (a) a semiconductor substrate having first and second longitudinally extending opposed surfaces;
    (b) a strip of lasing medium extending in a generally longitudinal plane formed on said first surface for emitting light out one end thereof;
    (c) a lens having an optical axis and formed in said second surface for collimating light received from said lasing medium; and
    (d) a laser light reflective surface formed adjacent one end of said strip and located at the intersection of the optical axis of the lens and the plane of the lasing medium.

2. The device of claim 1 further including an additional light reflective surface formed in said second surface concentric with said lens to reflect radiated light back to said lasing.

3. The device of claim 2 wherein the additional light reflective surface comprises a spherical mirror coaxial to said lens to reflect light back to said lasing medium to support light oscillation.

4. The device of claim 2 wherein the additional light reflective surface is a spherical mirror located radially inwardly concentric with said lens to reflect light back to said lasing medium.

5. The device of claim 1 wherein the lens is covered by a reflective coating such that light collimated by the lens is reflected back toward the first surface and partly transmitted out the first surface and partly reflected back to the lasing medium to sustain laser oscillation.

6. The device of claim 1 wherein the laser light reflective surface is an internally reflective surface formed at an angle of about 45° to the plane of the strip.

7. The device of claim 1 wherein the laser light reflective surface is an internally reflective parabolic surface the focal point of which is located in the plane of the strip.

8. The device of claim 1 wherein the collimated light is directed toward an external cavity.

9. The device of claim 1 further including an additional partly light reflective surface formed in the path of said reflected light.

10. In an array of surface emitting laser devices wherein a plurality of laser structures are formed on a single substrate, each having lasing strips extending in the plane of the substrate, the improvement comprising:
(a) a lens, having an optical axis, formed in the substrate on a surface oppositely adjacent each laser in a plane parallel to the plane of the substrate; and
(b) a laser light reflective surface formed laterally adjacent each said laser for reflecting laser light from said laser toward said lens for collimation, said laser light reflective surface located at the intersection of the optical axis of the lens and the plane of the lasing strips.

11. The array of claim 10 wherein the laser light reflective surface is a paraboloid.

12. The array of claim 10 wherein the laser light reflective surface is a 45° plane.

13. The array of claim 10 including a reflective mirror concentric to said lens.

14. The array of claim 10 wherein the lens is covered with a reflective material such that the collimated light is reflected back toward the substrate.

15. The method of forming a monolithic lens-laser device comprising the steps of:
(a) providing a semiconductor substrate having first and second planar opposed surfaces;
(b) forming a collimating lens, having an optical axis, in said first surface;
(c) forming a strip of active lasing material extending in the plane of said substrate surface over said second surface for emitting laser radiation out one edge of said strip; and
(d) forming a reflective surface located at the intersection of said optical axis and the plane of said strip.

16. The method of claim 15 wherein a reflective spherical mirror is formed concentric with the lens.

17. The method of claim 16 wherein the lens is located radially central to the mirror.

18. The method of claim 15 wherein, after the lens is formed, the reflective surface is located at the intersection by projecting light through the lens to form an image on the second surface, which image is used as an alignment reference to locate the reflective surface.

19. The method of claim 15 wherein the laser structure is formed of a buffer layer, active layer and cladding layer formed on a substrate of thickness H and in which the reflective surface is formed by a thermal mass transport process, in which stepped grooves are formed in the laser structure with a sidewall of a first step located a lateral distance $s_1$ from the optical axis of the lens and the active layer is undercut from the end wall a distance "u", and the buffer layer thickness is B, and wherein the focal length of the lens "F" equals: $H+B+s_1+\gamma$.

20. The method of claim 19 wherein prior to forming the lens, an alignment mark is formed in the substrate to a depth "v" and prior to forming the laser structure, the substrate surface on the laser side is removed to a depth "M" and wherein the focal length of the lens "F" equals $H-\gamma-M+B+s_1+\gamma$.

21. The method of claim 15 wherein the lens profile "Z" equals:

$$\frac{f}{n+1}\left[\sqrt{1+\frac{n+1}{n-1}\frac{\rho^2}{f^2}}-1\right]$$

wherein
"n" is the refractive index of the substrate
"$\tau$" is the radial distance from the lens axis to a point on the profile. and
"f" is the lens focal length.

22. The method of claim 15 wherein a spherical mirror is formed concentric to the lens and the radius of curvature of the spherical mirror "R" is:

$$\sqrt{(f-z'_3)^2+\rho'^2_3}$$

wherein
$z'_3$ is the lens thickness and
$\tau'_3$ is the axial radius of the lens.

23. In a monolithic mirror laser device, the improvement comprising:
(a) a semiconductor substrate having first and second longitudinally extending opposed surfaces;
(b) a strip of lasing medium for emitting light extending in a generally longitudinal plane formed over said first surface;
(c) a mirror formed in said substrate adjacent said second surface for reflecting and collimating light received from said lasing medium; and
(d) a laser light reflective surface formed adjacent one end of said strip and located at the intersection of the optical axis of the mirror and the plane of the lasing medium.

24. In an array of surface emitting laser devices wherein a plurality of laser structures are formed on a single substrate, each having lasing strips extending in the plane of the substrate, the improvement comprising:
(a) a mirror having an optical axis formed in the substrate on a surface oppositely adjacent each laser in a plane parallel to the plate of the substrate; and
(b) a laser light reflective surface formed laterally adjacent each said laser for reflecting laser light from said laser toward said mirror for reflection, said laser light reflective surface located at the intersection of the optical axis of the mirror and the plane of the lasing strips.

25. The array of claim 24 wherein the laser light reflective surface is a paraboloid.

26. The array of claim 24 wherein the laser light reflective surface is a 45° plane.

27. In a monolithic lens-laser device, the improvement comprising:
(a) a semiconductor substrate having first and second longitudinally extending opposed surfaces;
(b) a strip of lasing medium for emitting light extending in a generally longitudinal plane formed over said first surface;

(c) a lens formed in said substrate adjacent said second surface for collimating light received from said lasing medium;

(d) a first laser light reflective surface formed adjacent one end of said strip and located at the intersection of the optical axis of the lens and the plane of the lasing medium;

(e) a second light reflective mirror surface formed in said substrate concentric to said lens.

28. The device of claim 27 wherein the second light reflective surface comprises a spherical mirror coaxial to said lens to reflect light back to said lasing medium to support light oscillation.

29. The device of claim 27 wherein the second light reflective surface is a spherical mirror located radially inwardly concentric with said lens to reflect light back to said lasing medium.

30. The device of claim 27 wherein the first laser light reflective surface is an internally reflective surface formed at an angle of about 45° to the plane of the strip.

31. The device of claim 27 wherein the first laser light reflective surface is an internally reflective parabolic surface the focal point of which is located in the plane of the strip.

* * * * *

UNITED STATES PATENT AND TRADEMARK OFFICE
CERTIFICATE OF CORRECTION

PATENT NO. : 4,935,939
DATED : Jun. 19, 1990
INVENTOR(S) : Zong-Long Liau and James N. Walpole It is certified that error appears in the above-identified patent and that said Letters Patent is hereby corrected as shown below:

Col. 10, line 37, change "element" to ---improvement---.

Col. 10, line 42, change "on" to ---over---.

Col. 10, line 55, after "lasing" insert ---medium---.

Col. 11, line 67, change "γ" to ---u---.

Col. 12, line 17, change "τ" to ---ρ---.

Col. 12, line 18, change "." to ---,---.

Col. 12, line 29, change "τ" to ---ρ---.

Col. 12, line 51, change "plate" to ---plane---.

Signed and Sealed this

Seventeenth Day of September, 1991

Attest:

HARRY F. MANBECK, JR.

*Attesting Officer*  *Commissioner of Patents and Trademarks*